US009059793B2

(12) United States Patent
Shi et al.

(10) Patent No.: US 9,059,793 B2
(45) Date of Patent: Jun. 16, 2015

(54) NOISE SHAPING FOR SWITCHING CIRCUITRY (71) Applicant: QUALCOMM Incorporated, San Diego, CA (US)

(72) Inventors: Song S Shi, San Diego, CA (US); Lennart Karl-Axel Mathe, San Diego, CA (US); Liang Dai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 126 days.

(21) Appl. No.: 13/752,159

(22) Filed: Jan. 28, 2013

(65) Prior Publication Data

US 2014/0213208 A1 Jul. 31, 2014

(51) Int. Cl.
| G05F 1/00 | (2006.01) |
| H04B 15/00 | (2006.01) |
| G05F 1/10 | (2006.01) |
| H02M 1/12 | (2006.01) |
| H02M 1/44 | (2007.01) |
| H02M 3/156 | (2006.01) |
| H03F 3/217 | (2006.01) |
| H03F 1/02 | (2006.01) |

(52) U.S. Cl.
CPC ........ *H04B 15/00* (2013.01); *G05F 1/10* (2013.01); *H02M 1/12* (2013.01); *H02M 1/44* (2013.01); *H02M 3/156* (2013.01); *H03F 3/217* (2013.01); *H03F 1/0211* (2013.01); *H03F 2200/432* (2013.01)

(58) Field of Classification Search
CPC .................................................... H04B 15/00
USPC .......... 323/282, 283, 284, 274, 271; 700/298; 315/291, 294, 159
See application file for complete search history.

(56) References Cited

U.S. PATENT DOCUMENTS 6,141,541 A * 10/2000 Midya et al. .................... 455/91
6,300,826 B1 10/2001 Mathe et al.
(Continued)

FOREIGN PATENT DOCUMENTS

| CN | 101867284 A | 10/2010 |
| EP | 2063531 A1 | 5/2009 |
| EP | 2579456 A1 | 4/2013 |

OTHER PUBLICATIONS

Co-pending U.S. Appl. No. 13/361,785, filed Jan. 30, 2012.
Xiong X., et al., "Feed-Forwarding the Output Voltage to Improve Efficiency for Envelope-Tracking Power Supply Based on a Switch-Linear Hybrid Scheme", IEEE Transactions on Power Electronics, vol. 26, No. 8, pp. 2106-2111, Aug. 2011.
International Search Report and Written Opinion—PCT/US2014/012765—ISA/EPO—Feb. 4, 2015.

*Primary Examiner* — Matthew Nguyen
*Assistant Examiner* — Trinh Dang
(74) *Attorney, Agent, or Firm* — Fountainhead Law Group P.C.

(57) ABSTRACT

Techniques for creating one or more notch frequencies in the power density spectrum of an output voltage generated by switching circuitry. In an aspect, high- and low-side switches are coupled to an output voltage via an inductor. The spectral power of the output voltage at one or more frequencies is estimated, and the estimated spectral power is provided to a switch controller controlling the switches. The switch controller may be configured to switch the switches only in response to detecting that the estimated spectral power at the notch frequency is at a minimum. In certain exemplary aspects, the techniques may be incorporated in an envelope-tracking system, wherein the switching circuitry forms part of a switched-mode power supply (SMPS) supplying low-frequency power to a power amplifier load.

20 Claims, 8 Drawing Sheets

(56) References Cited

U.S. PATENT DOCUMENTS

| | | |
|---|---|---|
| 7,538,631 B2 | 5/2009 | Immonen et al. |
| 7,719,246 B2 | 5/2010 | Melanson |
| 8,089,256 B2 | 1/2012 | Kelly |
| 2008/0272758 A1* | 11/2008 | Melanson ............ 323/283 |
| 2009/0141526 A1 | 6/2009 | Jiang |
| 2009/0309654 A1* | 12/2009 | Khoury ............ 330/10 |
| 2010/0315837 A1 | 12/2010 | Demoulin et al. |
| 2011/0006743 A1 | 1/2011 | Fabbro |
| 2011/0279180 A1 | 11/2011 | Yamanouchi et al. |
| 2012/0183025 A1* | 7/2012 | Manickam et al. ........ 375/222 |
| 2013/0162233 A1* | 6/2013 | Marty ............ 323/274 |

\* cited by examiner (PRIOR ART)
FIG 1

NOISE SHAPING FOR SWITCHING CIRCUITRY

BACKGROUND

1. Field

The disclosure relates to techniques for noise shaping the power density spectrum of an output voltage generated by switching circuitry.

2. Background

Switched-mode power supplies (SMPS's) are commonly employed for their efficient power-delivery capabilities. In an SMPS, high- and low-side switches may be operated to regulate an output voltage, with the switches ideally dissipating no DC power. In some cases, however, the switching action undesirably generates noise at certain frequencies, which may interfere with other portions of circuitry provided with the SMPS. For example, in a wireless transceiver, the SMPS may be provided as part of an envelope-tracking (ET) system for a transmitter power amplifier. In this case, the operation of the high- and low-side switches may undesirably cause interference with an integrated receiver at one or more receive (RX) frequencies.

It would be desirable to provide simple and targeted techniques for reducing the noise generated by switching circuitry at one or more frequencies.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
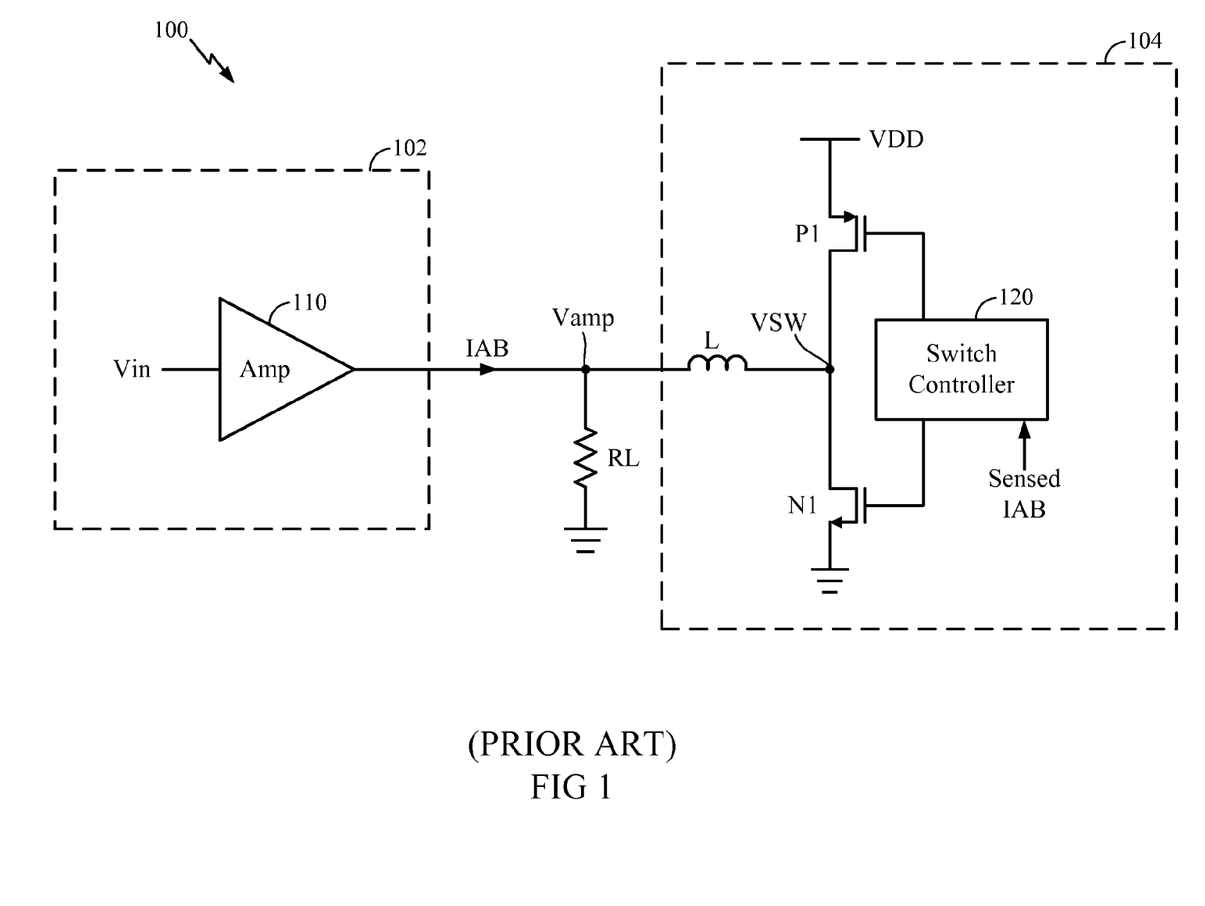
FIG. 1 illustrates a prior art system combining a switched-mode power supply with a linear amplifier for supplying power to a load.

FIG. 1 illustrates a prior art system 100 combining a switched-mode power supply (SMPS) with a linear amplifier for supplying power to a load. Note FIG. 1 is shown for illustrative purposes only, and is not meant to limit the scope of the present disclosure to switched-mode power supplies or switched-mode power supplies combined with linear amplifiers. In alternative exemplary embodiments, it will be appreciated that the techniques may be applied to control the noise generated by any type of switching circuitry combined with any types of amplifiers, e.g., Class D, E, or F type amplifiers. Such alternative exemplary embodiments are contemplated to be within the scope of the present disclosure.

In FIG. 1, a linear amplifier portion 102 includes amplifier 110 being driven by an input voltage Vin to generate an output voltage Vamp. The output of amplifier 110 is coupled to a load RL. Note amplifier 110 is configured to source or sink a current IAB to or from the load R. It will be appreciated that the linear amplifier portion 102 can be implemented using a variety of techniques known in the art. For example, the linear amplifier 110 may be designed as an op amp having differential inputs configured as a unity buffer to follow Vin. In general, the linear amplifier portion 102 may be designed using any amplifier design techniques known in the art, consistent with the principles of the present disclosure.

Further shown in FIG. 1 is a switched-mode power supply 104 operable to supply additional current to the load RL in conjunction with the linear amplifier portion 102. The switching portion 104 includes an inductor L coupled to transistor switches, including a high-side switch P1 and a low-side switch N1. The opening and closing (e.g., turning off and on) of the switches P1, N1 are configured by a switch controller 120 based on the requirements of the load RL, and may be performed according to a scheme such as further described hereinbelow with reference to FIG. 2.

In the implementation shown in FIG. 1, the switch controller 120 receives as input a sensed value of the current IAB. It will be appreciated that, conceptually, the current IAB may be sensed using a series-coupled ammeter. In practical implementation, a resistor may be provided in series between the output of amplifier 110 and Vamp, and the voltage drop across the resistor may be amplified.

According to principles known in the art, it will be appreciated that the linear amplifier 102 may supply the high-frequency content of the load current, as it may have a higher bandwidth and thereby be able to respond more quickly to changes to the target voltage Vin. On the other hand, the switching portion 104 may supply DC and low-frequency power, as the inductor L may generally be capable of supplying more load current at low frequency than the linear amplifier 102.

In certain configurations known in the art, the system 100 may be incorporated in an envelope tracking (ET) system, wherein the load RL is a power amplifier (or PA, not shown in FIG. 1), and the voltage Vamp supplied to the PA is configured to track the envelope of the output signal generated by the PA. In this manner, power transistors in the PA may be configured to operate continuously in full saturation, thereby maximizing the PA's efficiency. In an ET system, the amplifier 110 may itself be coupled to a supply voltage Vboost supplied by a boost converter (not shown) for enabling the output voltage of the amplifier 110 to exceed the voltage supply if necessary.

Figure 2:
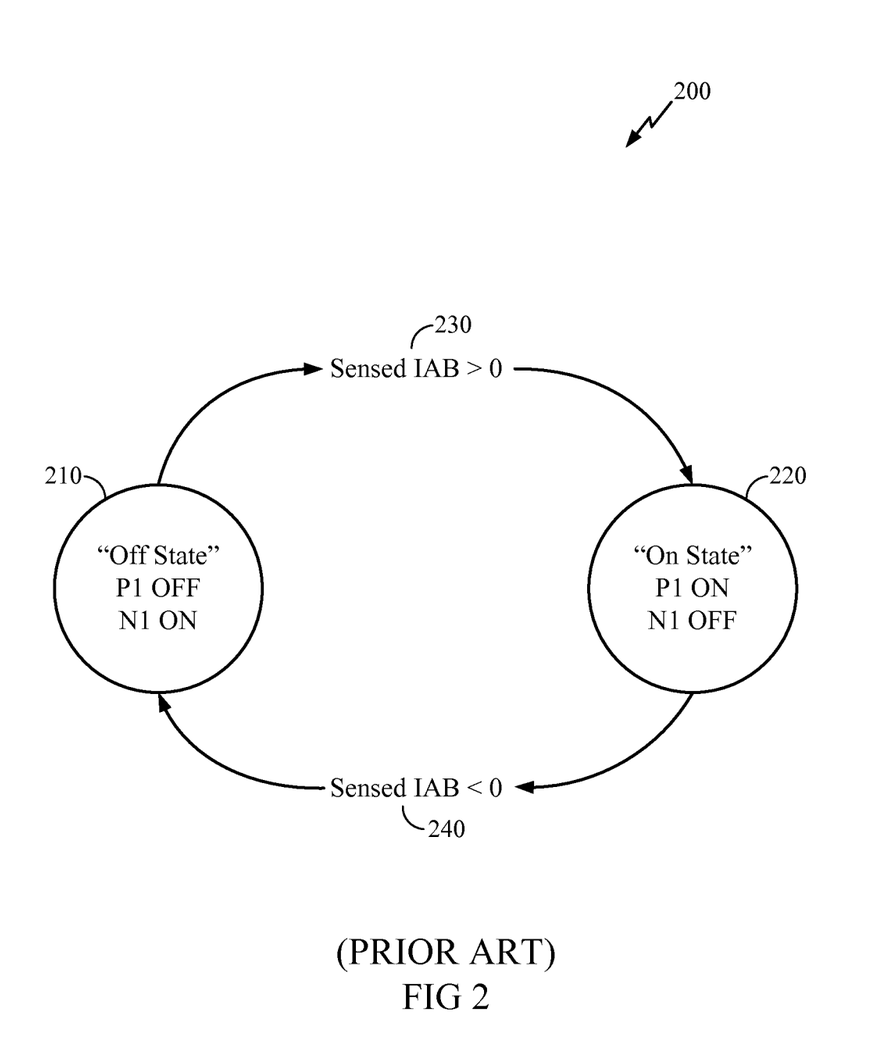
FIG. 2 illustrates a state diagram of a prior art switching scheme that may be applied by the switching controller.

FIG. 2 illustrates a state diagram 200 of a prior art switching scheme that may be applied by the switching controller 120. In FIG. 2, in an "Off state" 210, P1 is off and N1 is on. If the sensed IAB current is positive (i.e., positive current flows from the output of amplifier 110 to Vamp), as per condition 230 in FIG. 2, then the switch controller 120 may transition to the "On State" 220, wherein P1 is on and N1 is off From state 220, if the sensed IAB current is negative, as per condition 240, then the switch controller 120 may transition back to state 210.

It will be appreciated that the switching of transistors P1, N1 according to the state diagram 200 may undesirably generate noise in the switching voltage VSW. If such switching noise is not properly attenuated, then that noise may appear also on the voltage Vamp driving the load RL. For example, in implementations wherein the load RL is a PA, the switching noise may directly affect the output signal of the PA, thereby causing the PA to undesirably generate, e.g., out-of-band noise that can fall into the RX band of a radio receiver integrated with the system 100.

Figure 3:
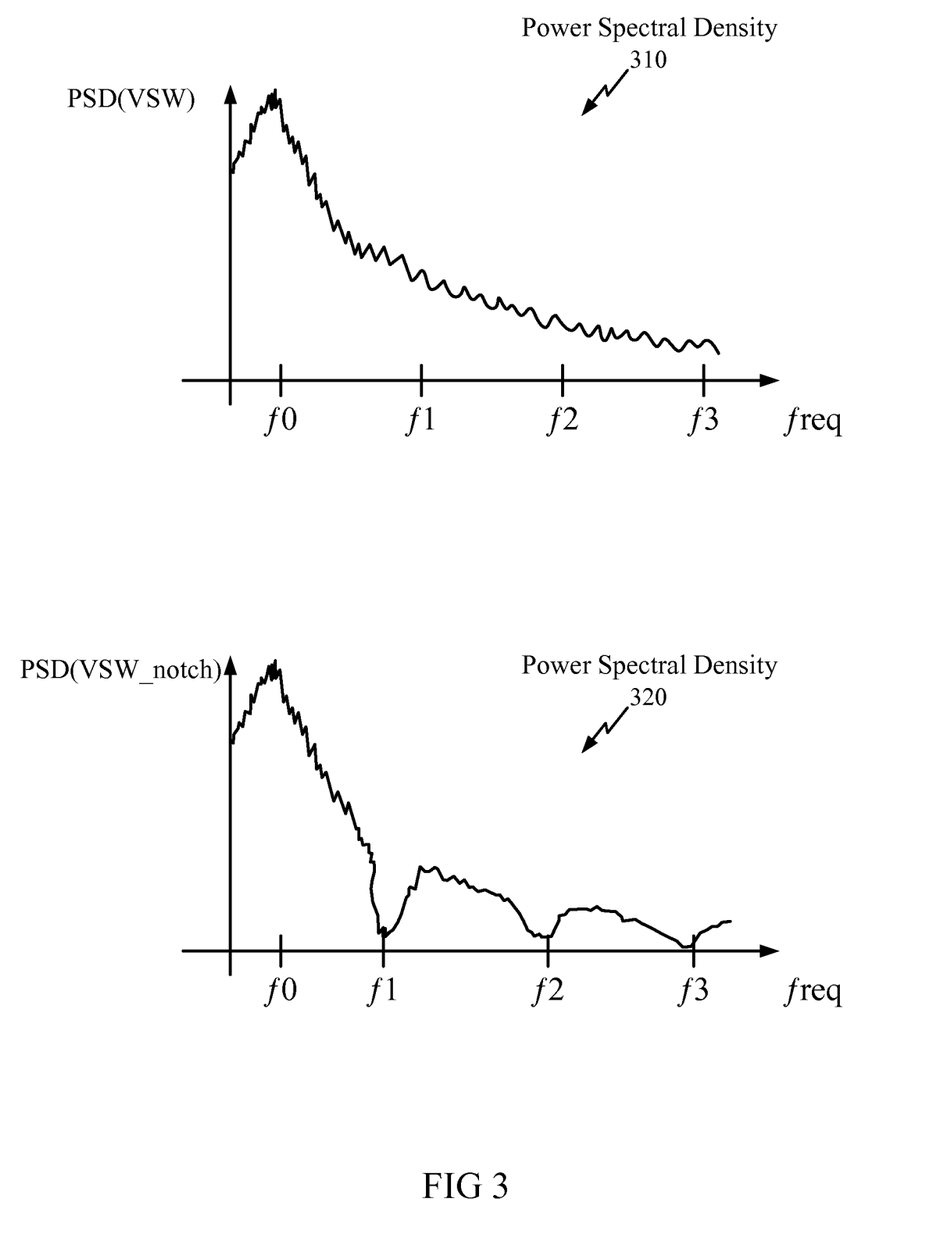
FIG. 3 illustrates exemplary power spectra of signal waveforms according to the present disclosure.

FIG. 3 illustrates exemplary power spectra of signal waveforms according to the present disclosure. Note FIG. 3 is shown for illustrative purposes only, and is not meant to limit the scope of the present disclosure to signal waveforms having the same or similar power spectra. In particular, plot 310 shows the power spectral density of the switching voltage VSW. In plot 310, significant power spectral components are seen around a frequency f0, with power spectral density decreasing as frequency increases. Note frequencies f1, f2, f3, etc. may correspond to receive (RX) frequencies of interest, e.g., frequencies corresponding to one or more radio channels that are being received by a receiver integrated with or otherwise in the proximity of the system 100. The presence of power spectral components at f1, f2, f3, etc., due to the switching voltage VSW may undesirably interfere with desired signal components at those frequencies, thereby negatively impacting the communications link budget.

It would be desirable to provide techniques to shape the spectrum of the switching voltage VSW to improve the noise characteristics of the system. In particular, it would be desirable to operate the switches P1, N1 in a manner such that one or more "notches" are created in the noise power spectral density of VSW. For example, plot 320 of FIG. 3 shows an exemplary spectrum of an alternative switching voltage, VSW_notch, wherein notches are present in the power spectral density at frequencies f1, f2, f3, etc. Note the three exemplary notches shown in plot 320 are for illustrative purposes only, and are not meant to limit the scope of the present disclosure to any particular number of notch frequencies, or relationships between such notch frequencies.

Figure 4:
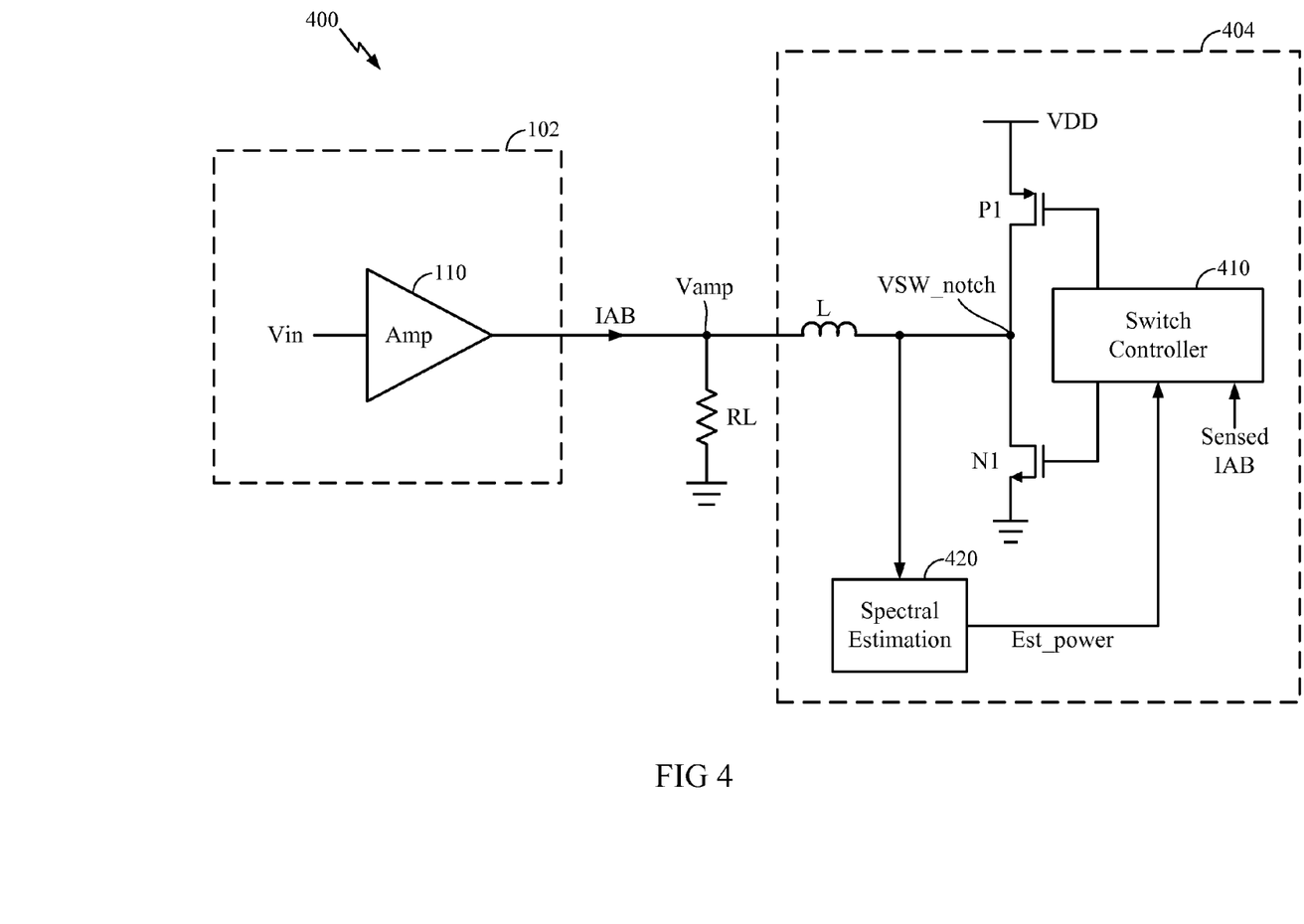
FIG. 4 illustrates an exemplary embodiment of the present disclosure, wherein one or more notches may be introduced into the switcher output spectrum.

FIG. 4 illustrates an exemplary embodiment of the present disclosure, wherein one or more notches may be introduced into the switching voltage power spectrum. Note similarly labeled elements in FIGS. 1 and 4 may correspond to elements performing similar functions, unless otherwise noted. In FIG. 4, the switching voltage of the switching section 404 is labeled as VSW_notch, to indicate that its spectral characteristics may differ from those of, e.g., VSW in FIG. 1. VSW_notch is coupled to a spectral estimation block 420. Block 420 is configured to output a signal Est_power indicating the spectral energy present at one or more predetermined frequencies in VSW_notch. In exemplary embodiments, the block 420 may be implemented, e.g., using exemplary techniques as further described hereinbelow with reference to FIGS. 7 and 8.

Figure 5:
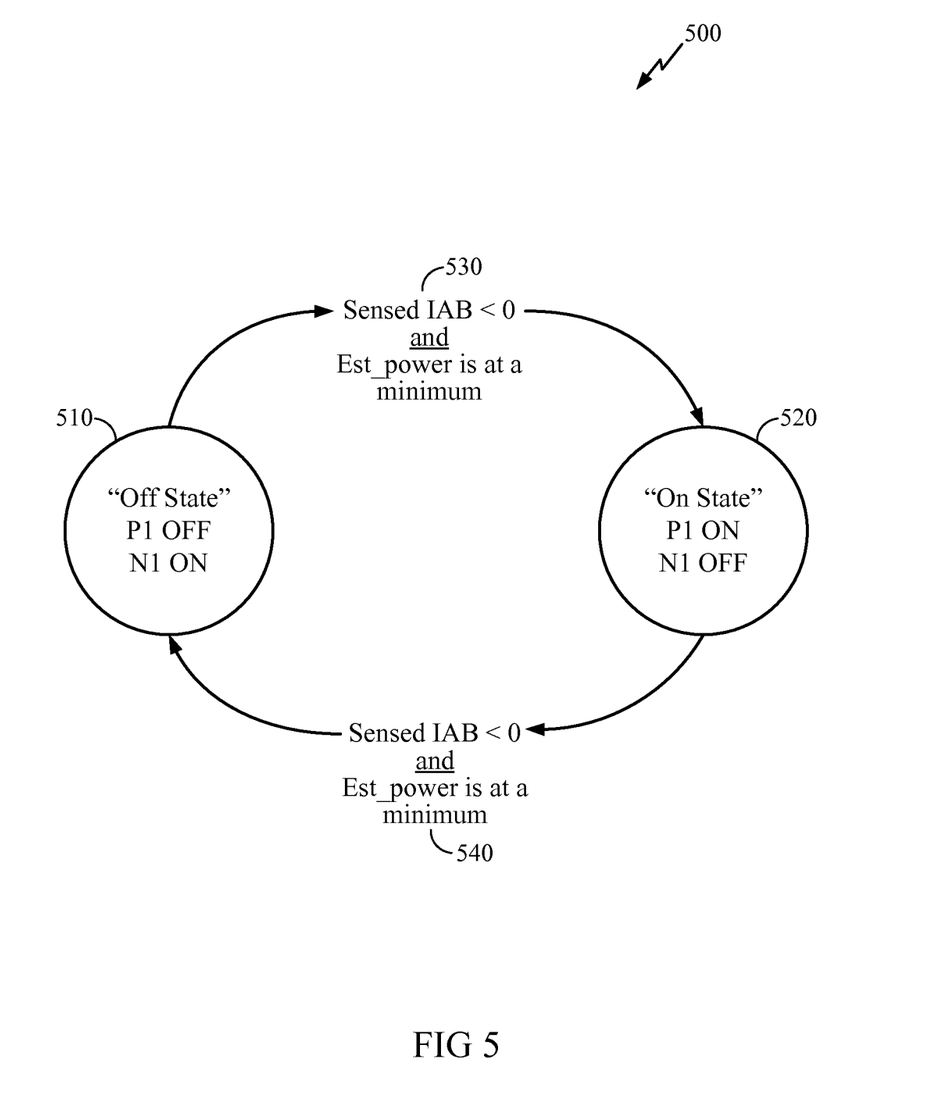
FIG. 5 illustrates an exemplary state diagram of a switching scheme that may be applied by the switching controller.

The switch controller 410 receives the signal Est_power as an input, and utilizes Est_power to drive the switches P1, N1. In particular, FIG. 5 illustrates an exemplary state diagram of a switching scheme that may be applied by the switching controller 410. In FIG. 5, in an "Off State" 510, P1 is off and N1 is on. If the sensed IAB current is positive and the signal Est_power is at a minimum (e.g., a local minimum), as per condition 530 in FIG. 5, then the switch controller 410 may transition to the "On State" 520, wherein P1 is on and N1 is off. From the "On State" 520, if the sensed IAB current is negative and the signal Est_power is at a minimum, as per condition 540, then the switch controller 410 may transition back to the "Off State" 510.

In an exemplary embodiment, the determination at conditions 530, 540 of whether Est_power is at a minimum may be made according to principles that may be readily derived by one of ordinary skill in the art. For example, Est_power may be successively sampled at discrete-time intervals (e.g., directly generated in discrete time by the spectral estimation block 420, or sampled from a continuous-time output of spectral estimation block 420 using a discrete-time sampler not shown) to generate a sequence of values Est_power(k), Est_power(k+1), etc., wherein k is an integer index. In an exemplary embodiment, to decide whether Est_power has reached a minimum value at an arbitrary instant k=K, it may be determined whether Est_power(K−1)>Est_power(K) and Est_power(K+1)>Est_power(K).

In light of the preceding description, it will be appreciated that providing the spectral estimation block 420 in FIG. 4 effectively enables negative-feedback closed-loop control of the switching voltage VSW_notch to create notches in the power spectrum of VSW_notch.

Figure 6:
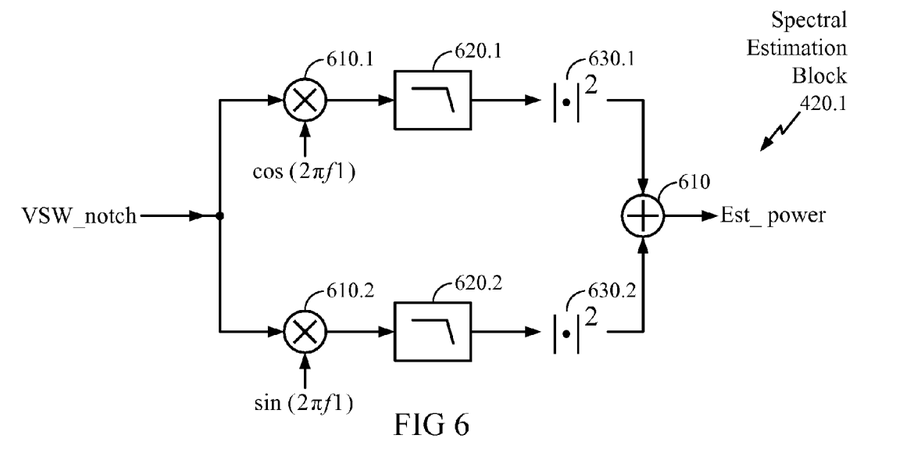
FIG. 6 illustrates an exemplary embodiment of the spectral estimation block.

FIG. 6 illustrates an exemplary embodiment 420.1 of the spectral estimation block 420. In FIG. 6, VSW_notch is provided to mixers 610.1, 610.2. Mixer 610.1 mixes VSW with a function $\cos(2\pi f1\ t)$, and mixer 610.2 mixes VSW with a function $\sin(2\pi f1\ t)$, wherein f1 represents the frequency at which the notch is desired to be placed. Following the mixers, filters 620.1, 620.2 low-pass filter (e.g., with a bandwidth of BW1) the down-converted outputs to extract the spectral density at baseband, and the outputs of the filters are provided to squaring blocks 630.1, 630.2. The outputs of squaring blocks 630.1, 630.2 are added at 640 to generate the signal Est_power. It will be appreciated that Est_power thus represents the energy present around f1, e.g., within a bandwidth of +/−BW1.

Figure 7:
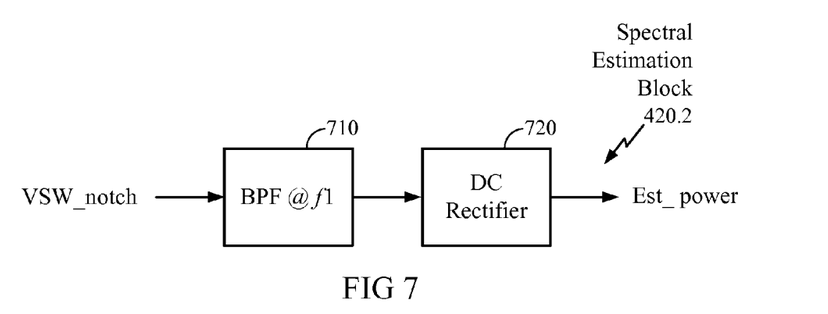
FIG. 7 illustrates an alternative exemplary embodiment of the spectral estimation block.

FIG. 7 illustrates an alternative exemplary embodiment 420.2 of the spectral estimation block 420. In FIG. 7, a bandpass filter (BPF) 710 with a center frequency of f1 is provided to filter VSW_notch, and a DC rectifier 720 is used to convert the output of the BPF 710 to a DC signal Est_power. While the spectral estimation block 420.2 requires fewer components than the spectral estimation block 420.1, it will be appreciated that in certain exemplary embodiments, the down-conversion circuitry in 420.1 may be less costly to implement than the band-pass filter 710 for a given notch frequency f1 and bandwidth BW1, depending on the sharpness of the roll-off desired in the BPF 710 transfer characteristic.

Figure 10:
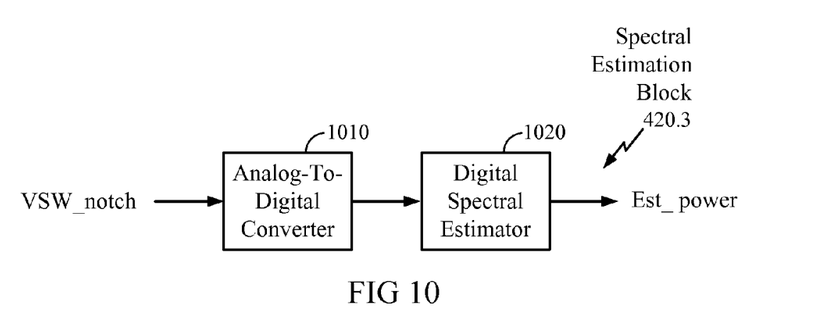
FIG. 10 illustrates an alternative exemplary embodiment of the spectral estimation block.

In an alternative exemplary embodiment (not shown), it will be appreciated that no DC rectifier 720 need be provided after the BPF 710, and the output of the BPF 710 may be provided directly as the signal Est_power. In this case, the frequency of the notch introduced in VSW_notch thereby may not correspond to the center frequency of the BPF 710, and may instead correspond to another frequency. It will further be appreciated that the spectral estimator may be implemented using techniques shown in the spectral estimation block 420.3 of FIG. 10, e.g., VSW_notch may be digitized by the analog-to-digital converter 1010, and digital spectral estimation techniques known in the art may be applied by the digital spectral estimator 1020. In general, the operations described herein, e.g., spectral estimation, may be implemented in either the analog or digital domain, as known to one of ordinary skill in the art. All such alternative exemplary embodiments are contemplated to be within the scope of the present disclosure.

Figure 8:
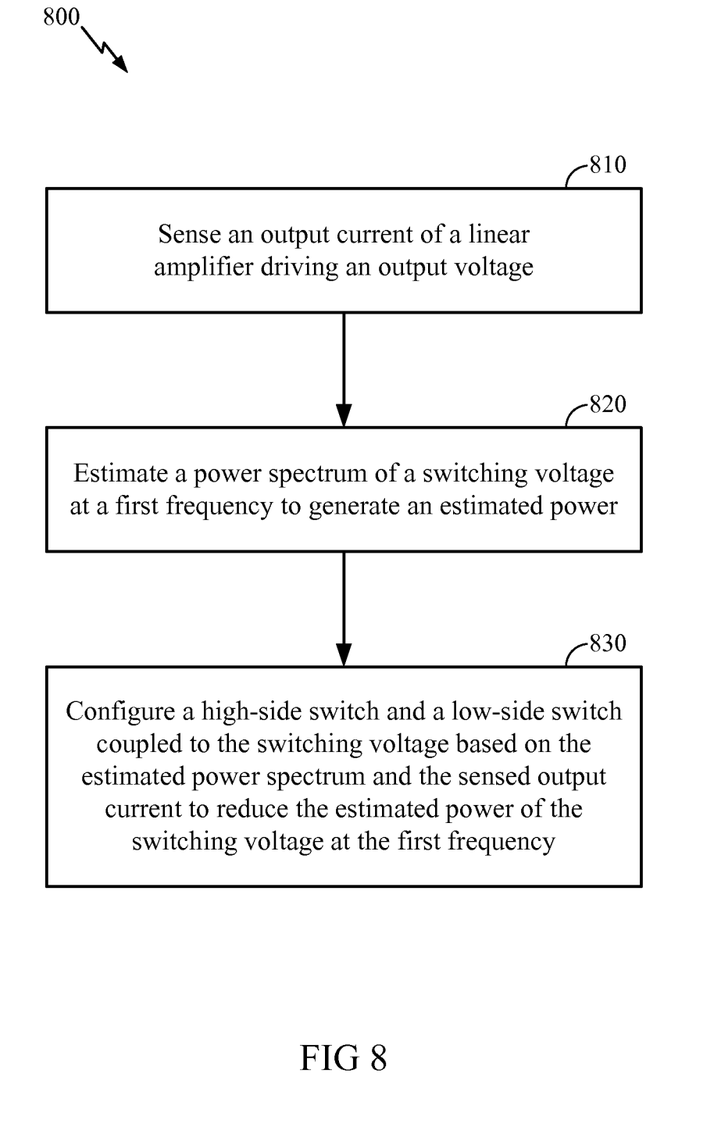
FIG. 8 illustrates an exemplary embodiment of a method according to the present disclosure.

FIG. 8 illustrates an exemplary embodiment of a method 800 according to the present disclosure. Note the method 800 is described for illustrative purposes only, and is not meant to limit the scope of the present disclosure to any particular exemplary embodiment of a method shown.

In FIG. 8, at block 810, an output current of a linear amplifier (110) driving an output voltage (Vamp) is sensed.

At block 820, a power spectrum of a switching voltage (VSW) at a first frequency (f1) is estimated to generate an estimated power (Est_power). In an exemplary embodiment, the switching voltage is coupled to the output voltage, e.g., via an inductor (L).

At block 830, a high-side switch (P1) and a low-side switch (N1) coupled to the switching voltage are configured based on the estimated power spectrum and the sensed output current to reduce the estimated power of the switching voltage at the first frequency.

It will be appreciated that the techniques disclosed herein may also be generally applied outside the context of an envelope tracking system, and such alternative exemplary embodiments are contemplated to be within the scope of the present disclosure. For example, in alternative exemplary embodiments, the linear amplifier 110 of FIG. 4 may be omitted, and the principles disclosed hereinabove may be readily applied to just the switching section 404 of the system 400 in FIG. 4. Furthermore, any types of buck converter, boost converter, or other switched-mode circuitry may employ the noise shaping techniques described hereinabove.

Figure 9:
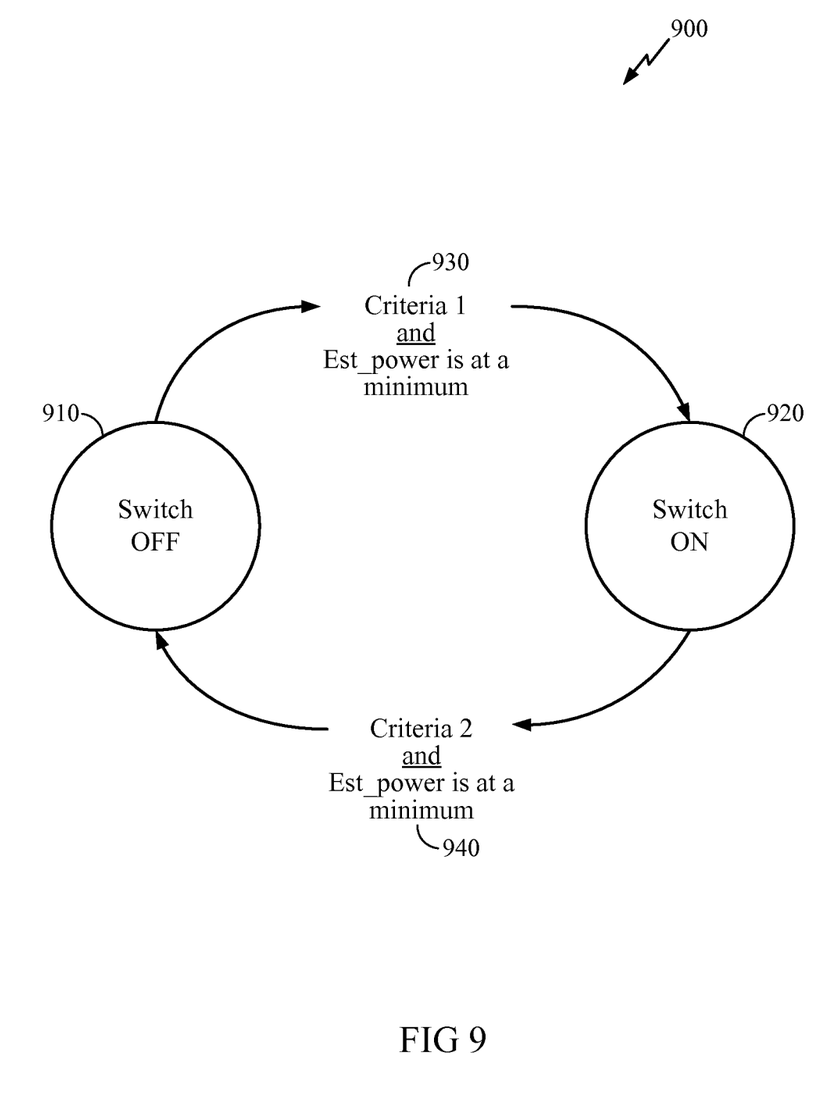
FIG. 9 illustrates an exemplary embodiment of a generalized state machine wherein the techniques of the present disclosure may be applied.

FIG. 9 illustrates an exemplary embodiment of a generalized state machine 900 wherein the techniques of the present disclosure may be applied. In FIG. 9, a state 910 corresponds to a switch being off, and state 920 corresponds to the switch being on. State 910 transitions to state 920 based on condition 930, which specifies that a first criteria (Criteria 1) must be met, and the estimated power (Est_power) must be at a minimum for the transition to occur. Similarly, state 920 transitions to state 910 based on condition 940, which specifies that a second criteria (Criteria 2) must be met, and the estimated power (Est_power) must be at a minimum for the transition to occur. In an exemplary embodiment, the estimated power may be computed, e.g., as described with reference to the spectral estimation block 420 in FIG. 4, while the determination of the minimum value may also be made, e.g., as previously described hereinabove.

One of ordinary skill in the art will appreciate that the generalized state machine 900 may be applicable to a variety of switching applications to create one or more frequency notches in an output switching voltage of interest. For example, in a buck converter utilizing voltage-mode control, Criteria 1 may correspond to the output voltage dropping below a threshold voltage, while Criteria 2 may correspond to the output voltage being above a threshold voltage. In light of the present disclosure, one of ordinary skill in the art may readily derive alternative applications of the techniques disclosed herein. Such alternative exemplary embodiments are contemplated to be within the scope of the present disclosure.

Note FIGS. 5 and 9 are shown for illustrative purposes only, and are not meant to limit the scope of the present disclosure. In alternative exemplary embodiments, state machines having more than two states may readily accommodate the noise shaping techniques of the present disclosure. For example, in an alternative exemplary embodiment, the techniques described herein may be readily adapted to accommodate a three-state state machine which has a third state corresponding to both N1 and P1 off. Such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus, comprising:
   a spectral estimator configured to estimate a power spectrum of a switching voltage at a first frequency to generate an estimated power spectrum, the switching voltage coupled to an output voltage; and
   a switch controller configured to control a high-side switch and a low-side switch coupled to the switching voltage based on the estimated power spectrum and a set of switching criteria to reduce the estimated power spectrum at the first frequency,
   wherein the set of switching criteria is based on a sensed output current of a linear amplifier driving the output voltage, the switch controller configured to:
      from a first state wherein the high-side switch is off and the low-side switch is on, transition to a second state wherein the high-side switch is on and the low-side switch is off, based on the conditions that the sensed output current is greater than zero and the estimated power spectrum is at a minimum; and
      from the second state, transition to the first state, based on the conditions that the sensed output current is less than zero and the estimated power spectrum is at a minimum.

2. The apparatus of claim 1, the switch controller further configured to detect the estimated power spectrum to be at a minimum when:
   a first value of the estimated power spectrum is greater than a second value, the second value following the first value in time; and
   a second value of the estimated power spectrum is less than a third value, the third value following the second value in time.

3. The apparatus of claim 1, the spectral estimator comprising:
   at least one mixer configured to down-convert the switching voltage using at least one local oscillator having a first frequency;
   at least one low-pass filter configured to filter the switching voltage having been down-converted, as at least one low-pass filter output; and
   an energy estimator configured to estimate the energy in the at least one low-pass filter output.

4. The apparatus of claim 1, the switch controller further configured to control the switches based on a detected envelope of a power amplifier output, the linear amplifier further configured to drive the output voltage in response to an input voltage tracking the detected envelope of the load.

5. The apparatus of claim 1, the spectral estimator comprising:
   a band-pass filter coupled to the switching voltage.

6. The apparatus of claim 1, the spectral estimator comprising:
   an analog-to-digital converter configured to digitize the switching voltage; and
   a digital spectral estimator for estimating the spectral components in the switching voltage having been digitized.

7. The apparatus of claim 1, further comprising a receiver configured to receive at one or more receive frequencies, the first frequency corresponding to one of the one or more receive frequencies.

8. The apparatus of claim 1, the spectral estimator further configured to estimate the power spectrum of a switching voltage at a plurality of frequencies including the first frequency.

9. An apparatus, comprising:
- a spectral estimator configured to estimate a power spectrum of a switching voltage at a first frequency to generate an estimated power spectrum, the switching voltage coupled to an output voltage; and
- a switch controller configured to control a high-side switch and a low-side switch coupled to the switching voltage based on the estimated power spectrum and a set of switching criteria to reduce the estimated power spectrum at the first frequency,
- wherein the spectral estimator comprises a band-pass filter coupled to the switching voltage, and
- wherein the spectral estimator and the switch controller are provided on an integrated circuit, the band-pass filter being provided off-chip from the integrated circuit.

10. The apparatus of claim 9, the switch controller further configured to detect the estimated power spectrum to be at a minimum when:
- a first value of the estimated power spectrum is greater than a second value, the second value following the first value in time; and
- a second value of the estimated power spectrum is less than a third value, the third value following the second value in time.

11. The apparatus of claim 9, the spectral estimator further configured to estimate the power spectrum of a switching voltage at a plurality of frequencies including the first frequency.

12. A method comprising:
- sensing an output current of a linear amplifier driving an output voltage, as a sensed output current;
- estimating a power spectrum of a switching voltage at a first frequency to generate an estimated power spectrum, the switching voltage coupled to the output voltage; and
- configuring a high-side switch and a low-side switch coupled to the switching voltage based on the sensed output current and the estimated power spectrum to reduce the estimated power spectrum at the first frequency,
- wherein configuring the switches comprises:
  - from a first state wherein the high-side switch is off and the low-side switch is on, transitioning to a second state wherein the high-side switch is on and the low-side switch is off, based on the conditions that the sensed output current is greater than zero and the estimated power spectrum is at a minimum; and
  - from the second state, transitioning to the first state, based on the conditions that the sensed output current is less than zero and the estimated power spectrum is at a minimum.

13. The method of claim 12, further comprising detecting the estimated power spectrum to be at a minimum when:
- a first value of the estimated power spectrum is greater than a second value, the second value following the first value in time; and
- a second value of the estimated power spectrum is less than a third value, the third value following the second value in time.

14. The method of claim 12, the estimating the power spectrum comprising:
- down-converting the switching voltage using at least one local oscillator having a first frequency;
- low-pass filtering the switching voltage having been down-converted, as a low-pass filtered output; and
- computing the energy of the low-pass filtered output.

15. The method of claim 12, the estimating the power spectrum comprising:
- band-pass filtering the switching voltage, as a band-pass filtered switching voltage; and
- DC rectifying the band-pass filtered switching voltage to generate the estimated power spectrum.

16. The method of claim 12, the estimating the power spectrum comprising band-pass filtering the switching voltage to generate the estimated power spectrum.

17. An apparatus comprising:
- means for estimating a power spectrum of a switching voltage at a first frequency to generate an estimated power spectrum, the switching voltage coupled to an output voltage; and
- means for controlling a high-side switch and a low-side switch coupled to the switching voltage based on the estimated power spectrum and a set of switching criteria to reduce the estimated power spectrum at the first frequency,
- wherein the set of switching criteria is based on a sensed output current of a linear amplifier driving the output voltage, the means for controlling configured to:
  - from a first state wherein the high-side switch is off and the low-side switch is on, transition to a second state wherein the high-side switch is on and the low-side switch is off, based on the conditions that the sensed output current is greater than zero and the estimated power spectrum is at a minimum; and
  - from the second state, transition to the first state, based on the conditions that the sensed output current is less than zero and the estimated power spectrum is at a minimum.

18. The apparatus of claim 17, further comprising:
means for additionally driving an output voltage coupled to the switching voltage in response to an input voltage tracking a detected envelope of a load coupled to the output voltage.

19. The apparatus of claim 17, further comprising:
means for receiving a receive (RX) signal at a receive frequency, the receive frequency corresponding to one frequency of the at least one frequency.

20. The apparatus of claim 17, the means for controlling comprising a buck converter.

* * * * *